United States Patent
Takeda et al.

(10) Patent No.: US 6,737,214 B2
(45) Date of Patent: May 18, 2004

(54) CHEMICAL AMPLIFICATION RESIST COMPOSITIONS

(75) Inventors: Takanobu Takeda, Nakakubiki-gun (JP); Osamu Watanabe, Nakakubiki-gun (JP); Kazuhiro Hirahara, Nakakubiki-gun (JP); Katsuya Takemura, Nakakubiki-gun (JP); Wataru Kusaki, Nakakubiki-gun (JP); Akihiro Seki, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 15 days.

(21) Appl. No.: 09/800,512

(22) Filed: Mar. 8, 2001

(65) Prior Publication Data

US 2001/0031421 A1 Oct. 18, 2001

(30) Foreign Application Priority Data

Mar. 9, 2000 (JP) ........................................ 2000-064277

(51) Int. Cl.$^7$ ............................. G03C 1/73; G03F 7/039; C08L 31/02; C08L 33/08; C08L 33/10; C08L 25/00
(52) U.S. Cl. .................... 430/270.1; 430/325; 430/326; 430/905; 430/909; 430/910; 430/914; 525/219; 525/222; 525/223; 525/227; 525/241
(58) Field of Search .............................. 430/270.1, 326, 430/905, 909, 910, 914, 325; 525/219, 222, 223, 227, 241

(56) References Cited

U.S. PATENT DOCUMENTS

| 4,491,628 A | | 1/1985 | Ito et al. ..................... 430/176 |
| 4,603,101 A | | 7/1986 | Crivello ................... 430/270.1 |
| 5,252,435 A | | 10/1993 | Tani et al. .................. 430/325 |
| 5,324,804 A | | 6/1994 | Steinmann .................. 526/313 |
| 5,443,690 A | * | 8/1995 | Takechi et al. ........... 430/286.1 |
| 5,843,624 A | * | 12/1998 | Houlihan et al. ............ 430/296 |
| 5,962,184 A | * | 10/1999 | Allen et al. ............... 430/270.1 |
| 6,156,481 A | * | 12/2000 | Takeda et al. ............ 430/270.1 |
| 6,235,446 B1 | * | 5/2001 | Ikemura et al. .......... 430/270.1 |
| 6,284,427 B1 | * | 9/2001 | Okazaki et al. .......... 430/270.1 |
| 6,284,438 B1 | * | 9/2001 | Choi et al. .................. 430/322 |
| 6,342,542 B1 | * | 1/2002 | Kobayashi et al. ......... 522/173 |

FOREIGN PATENT DOCUMENTS

| EP | 249 139 | 7/1994 |
| JP | 62-115440 | 5/1987 |
| JP | 63-27829 | 2/1988 |
| JP | 2-27660 | 6/1990 |
| JP | 3-223858 | 10/1991 |
| JP | 4-211258 | 8/1992 |
| JP | 6-100488 | 4/1994 |
| JP | 8-101509 | 4/1996 |
| JP | 8-146610 | 6/1996 |

OTHER PUBLICATIONS

*Aldrich's Catalog Handbook of Fine Chemicals (1996–1997)* published by Aldrich Chemical Co., Inc. in 1996 p. 1242.*
English abstract of JP 8–101509.
English abstract of JP 8–146610.
English abstract of JP 4–211258.

* cited by examiner

*Primary Examiner*—Mark F. Huff
*Assistant Examiner*—Sin J. Lee
(74) *Attorney, Agent, or Firm*—Millen, Whtie, Zelano & Branigan, P.C.

(57) ABSTRACT

A chemical amplification positive resist composition comprising a polymeric mixture of a polyhydroxystyrene derivative having a Mw of 1000–500,000 and a copolymer of hydroxystyrene and (meth)acrylate having a Mw of 1000–500,000, as a base resin, has improved dry etching resistance, high sensitivity, high resolution, and process adaptability, and is suppressed in the slimming of pattern films after development with aqueous base.

16 Claims, No Drawings

CHEMICAL AMPLIFICATION RESIST COMPOSITIONS

This invention relates to a chemical amplification resist composition, especially of the positive acting type, having a high sensitivity and resolution, and suitable as a micropatterning material for VLSI fabrication.

BACKGROUND OF THE INVENTION

While a number of recent efforts are being made to achieve a finer pattern rule in the drive for higher integration and operating speeds in LSI devices, deep-ultraviolet, EB, EUV and x-ray lithographic techniques are thought to hold particular promise as the next generation in microfabrication technology. Deep-UV lithography is capable of achieving a minimum feature size of 0.24 μm or less, and can form patterns with sidewalls that are nearly perpendicular to the substrate, when a resist having low light absorption is used.

Recently developed acid-catalyzed chemically amplified positive resists, such as those described in JP-B 2-27660, JP-A 63-27829, U.S. Pat. No. 4,491,628 and U.S. Pat. No. 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base polymer and a photoacid generator, and three-component systems comprising a base polymer, a photoacid generator, and a dissolution regulator having acid labile groups.

For example, JP-A 62-115440 describes a resist comprising poly-4-tert-butoxystyrene and a photoacid generator. JP-A 3-223858 describes a similar two-component resist comprising a resin bearing tert-butoxy groups within the molecule, in combination with a photoacid generator. JP-A 4-211258 describes a two-component resist which is comprised of polyhydroxystyrene bearing methyl, isopropyl, tert-butyl, tetrahydropyranyl, and trimethylsilyl groups, together with a photoacid generator. JP-A 6-100488 discloses a resist comprised of a polydihydroxystyrene derivative, such as poly[3,4-bis(2-tetrahydropyranyloxy) styrene], poly[3,4-bis(tert-butoxycarbonyloxy)styrene] or poly[3,5-bis(2-tetrahydropyranyloxy)styrene], and a photoacid generator. These resists, however, have the drawbacks of slimming of a pattern film after development with an aqueous base solution and poor resistance to dry etching.

Also known in the art are resist compositions using copolymers of hydroxystyrene with (meth)acrylate for achieving a higher transparency and improving the adhesion to the substrate as disclosed in JP-A 8-101509 and 8-146610. The resist compositions of this type suffer from low heat resistance, partial pattern collapse, and pattern shape footing.

SUMMARY OF THE INVENTION

An object of the invention is to provide a chemical amplification type resist composition which has a higher sensitivity, resolution, dry etching resistance and process adaptability than conventional resist compositions, and is improved in the slimming of a pattern film after development with an aqueous base solution.

The invention provides a chemical amplification type resist composition comprising a polymeric mixture of a polymer comprising recurring units of the general formula (1) and having a weight average molecular weight of 1,000 to 500,000 and a polymer comprising recurring units of the general formula (2) and having a weight average molecular weight of 1,000 to 500,000. The combined use of the polymers of formulas (1) and (2) gives an effective base resin for a chemical amplification positive resist composition. The chemical amplification positive resist composition comprising the polymeric mixture, a photoacid generator and an organic solvent has a high sensitivity, high resolution, dry etching resistance and process adaptability, and is improved in the slimming of a pattern film after development with an aqueous base solution. The composition is thus well suited for practical use and advantageously used in precise microfabrication, especially in VLSI manufacture.

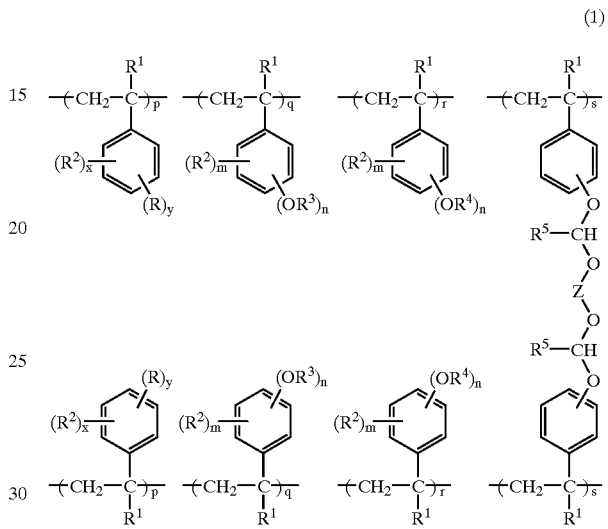

(1)

Herein R is a hydroxyl group or a $OR^3$ group, $R^1$ is hydrogen or methyl, $R^2$ is a straight, branched or cyclic alkyl group of 1 to 8 carbon atoms, $R^3$ and $R^4$ each are an acid labile group, $R^5$ is methyl or ethyl, Z is a straight, branched or cyclic alkylene group of 1 to 10 carbon atoms, x is 0 or a positive integer, y is a positive integer, satisfying $x+y \leq 5$, m is 0 or a positive integer, n is a positive integer, satisfying $m+n \leq 5$, p, q, r and s each are 0 or a positive number, satisfying $p+q+r+s=1$.

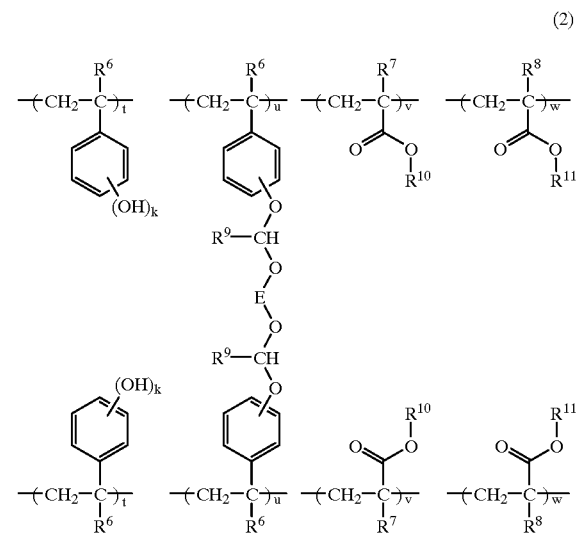

(2)

Herein $R^6$, $R^7$ and $R^8$ each are hydrogen or methyl, $R^9$ is methyl or ethyl, E is a straight, branched or cyclic alkylene group of 1 to 10 carbon atoms, $R^{10}$ is a straight, branched or cyclic alkyl group of 1 to 20 carbon atoms, which may contain an oxygen or sulfur atom, $R^{11}$ is a tertiary alkyl group of 1 to 20 carbon atoms, k is 0 or a positive integer of up to 5, t and w each are a positive number, u and v each are 0 or a positive number, either one of u and v is not equal to 0, satisfying t+u+v+w=1.

When the polymers of formulas (1) and (2) are formulated together in a resist composition, they cooperate to give greater advantages than compensating for their shortcomings. More particularly, when only the polymer of formula (1) is used, the resulting resist composition has the advantages of high sensitivity and resolution, but the disadvantages of poor dry etching resistance and considerable slimming of a pattern film after development with an aqueous base solution. On the other hand, when the polymer of formula (2) is used alone, the resulting resist composition has the advantages of good dry etching resistance and relatively suppressed slimming of a pattern film after development with an aqueous base solution, but the disadvantages of low sensitivity and pattern shape footing.

In contrast, formulating both the polymers of formulas (1) and (2) with other resist components results in a chemical amplification positive resist composition which has a higher sensitivity, resolution, dry etching resistance and process adaptability than the single use of each polymer, and forms a pattern film which undergoes a relatively small reduction of its thickness after development with an aqueous base solution.

DESCRIPTION OF THE PREFERRED EMBODIMENT

Polymer

The chemical amplification type resist composition of the invention is characterized by comprising a polymeric mixture of a polymer comprising recurring units of the general formula (1) and having a weight average molecular weight of 1,000 to 500,000 and a polymer comprising recurring units of the general formula (2) and having a weight average molecular weight of 1,000 to 500,000.

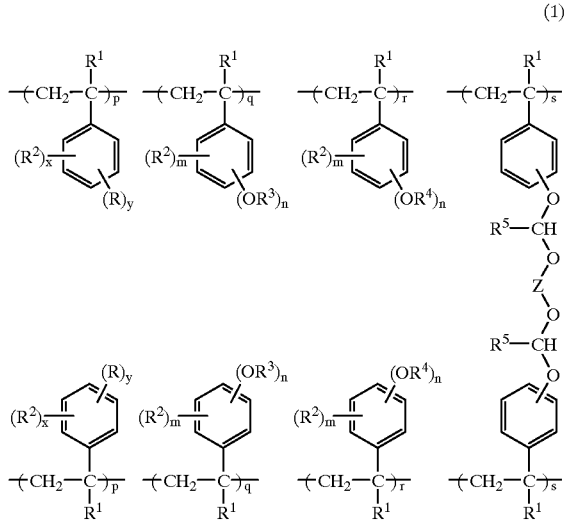

(1)

In formula (1), R is a hydroxyl group or a $OR^3$ group, $R^1$ is hydrogen or methyl, $R^2$ is a straight, branched or cyclic alkyl group of 1 to 8 carbon atoms, $R^3$ and $R^4$ each are an acid labile group, $R^5$ is methyl or ethyl, Z is a straight, branched or cyclic alkylene group of 1 to 10 carbon atoms, x is 0 or a positive integer, y is a positive integer, satisfying x+y≦5, m is 0 or a positive integer, n is a positive integer, satisfying m+n≦5, p, q, r and s each are 0 or a positive number, satisfying p+q+r+s=1.

Examples of the straight, branched or cyclic alkyl group include methyl, ethyl, propyl, isopropyl, n-butyl, isobutyl, tert-butyl, cyclopentyl and cyclohexyl.

The acid labile groups represented by $R^3$ and $R^4$ are selected from a variety of such groups, preferably from among the groups of the following formulas (3) and (4), branched or cyclic, tertiary alkyl groups with 4 to 20 carbon atoms, trialkylsilyl groups whose alkyl groups each have 1 to 6 carbon atoms, and oxoalkyl groups of 4 to 20 carbon atoms. It is noted that the acid labile groups represented by $R^3$ and $R^4$ are different.

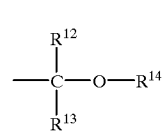

(3)

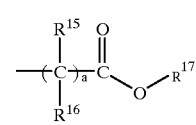

(4)

In formula (3), $R^{12}$ and $R^{13}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{14}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

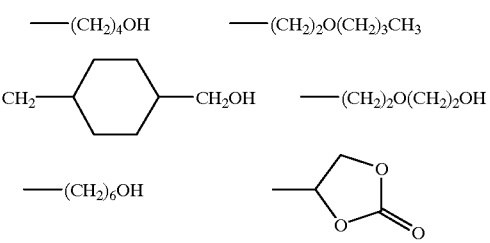

A pair of $R^{12}$ and $R^{13}$, a pair of $R^{12}$ and $R^{14}$, or a pair of $R^{13}$ and $R^{14}$, taken together, may form a ring. Each of $R^{12}$, $R^{13}$ and $R^{14}$ is a straight or branched alkylene group of 1 to 18 carbon atoms, preferably 1 to 10 carbon atoms, when they form a ring.

In formula (4), $R^{15}$ and $R^{16}$ are as illustrated for $R^{12}$ and $R^{13}$. The organic groups of 4 to 40 carbon atoms represented by $R^{17}$ include straight, branched or cyclic alkyl groups of 4 to 40 carbon atoms, especially tertiary alkyl groups of 4 to 20 carbon atoms, more preferably 4 to 15 carbon atoms, trialkylsilyl groups whose alkyl groups each have 1 to 6 carbon atoms, oxoalkyl groups of 4 to 20 carbon atoms, and groups of formula (3). Exemplary tertiary alkyl groups are tert-butyl, tert-amyl, 1,1-diethylpropyl, 1-methylcyclopentyl, 1-ethylcyclopentyl, 1-isopropylcyclopentyl, 1-butylcyclopentyl, 1-methylcyclohexyl, 1-ethylcyclohexyl, 1-isopropylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups include trimethylsilyl, triethylsilyl, and dimethyl-tert-butylsilyl. Exemplary oxoalkyl groups include 3-oxocyclohexyl, 4-methyl-2-oxooxan-4-yl, and 5-methyl-2-oxooxoran-5-yl. The letter "a" is an integer of 0 to 6.

Of the acid labile groups of formula (3), the straight or branched groups are exemplified below.

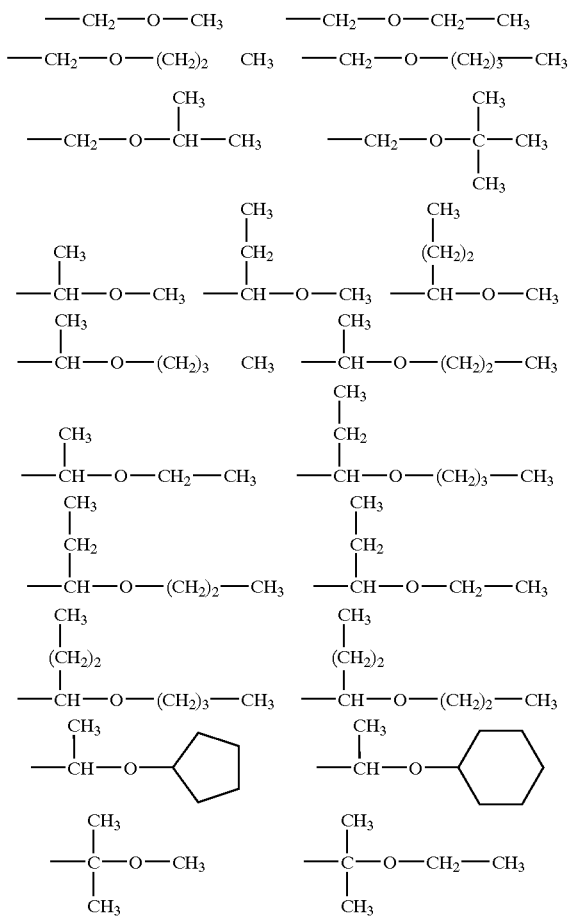

Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl.

Examples of the acid labile groups of formula (4) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the tertiary alkyl groups of 4 to 20 carbon atoms, preferably 4 to 15 carbon atoms include tert-butyl, tert-amyl, tert-ethyl-3-pentyl and dimethylbenzyl as well as 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Exemplary trialkylsilyl groups whose alkyl groups each have 1 to 6 carbon atoms are trimethylsilyl, triethylsilyl, and tert-butyldimethylsilyl.

Exemplary oxoalkyl groups of 4 to 20 carbon atoms are 3-oxocyclohexyl and groups of the following formulas.

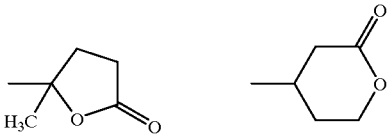

In formula (1), p, q, r and s each are 0 or a positive number, especially p, q and r are positive numbers and s is 0 or a positive number, and they satisfy p+q+r+s=1, preferably $0<(q+r)/(p+q+r+s) \leq 0.8$, especially $0.07 \leq (q+r)/(p+q+r+s) \leq 0.5$, and $0.01 \leq s/(p+q+r+s) \leq 0.1$, especially $0.01 \leq s/(p+q+r+s) \leq 0.05$. If any one of p, q and r is equal to 0, there may result a reduced contrast of alkali dissolution rate and a poor resolution. If the proportion of q+r relative to the total is in excess of 0.8 or if the proportion of s relative to the total is in excess of 0.1, the polymer may become gel due to over crosslinking, lose solubility in alkali solution, induce film thickness changes, in-film stresses or bubbles upon alkali development, and become less adhesive to the substrate due to the shortage of hydrophilic groups. By properly selecting the values of p, q and r within the above-defined ranges, it becomes possible to control the size and configuration of a resist pattern as desired.

It is noted that the content of acid labile groups in the polymer has a substantial influence on the dissolution rate contrast of a resist film and governs the properties of the resist composition relating to the size and configuration of a resist pattern.

In the polymer comprising recurring units of formula (1), the acid labile groups represented by $R^3$ and $R^4$ are preferably those of formulas (3) and (4) while the recurring units may be units of one type or a combination of units of two or more types.

(2)

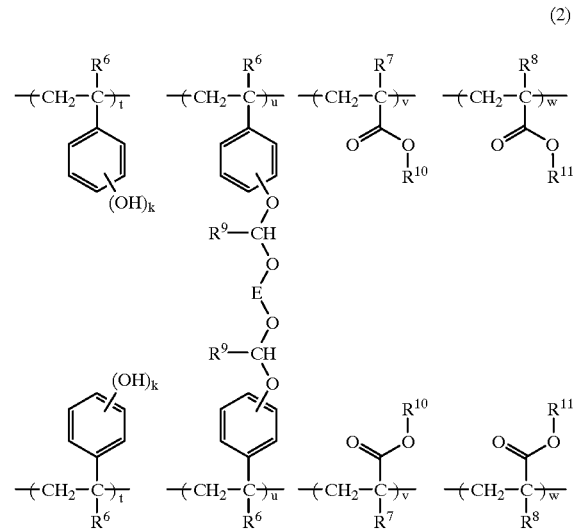

In formula (2), $R^6$, $R^7$ and $R^8$ each are hydrogen or methyl, $R^9$ is methyl or ethyl, E is a straight, branched or cyclic alkylene group of 1 to 10 carbon atoms, $R^{10}$ is a straight, branched or cyclic alkyl group of 1 to 20 carbon atoms or a straight, branched or cyclic alkyl group of 1 to 20 carbon atoms which contains an oxygen or sulfur atom, $R^{11}$ is a tertiary alkyl group of 1 to 20 carbon atoms, k is 0 or a positive integer of up to 5, t and w each are a positive number, u and v each are 0 or a positive number, either one of u and v is not equal to 0, satisfying t+u+v+w=1.

The acid labile group represented by $R^{11}$ is selected from a variety of such groups, preferably from among the groups of the following formulas (5) and (6).

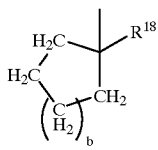

(5)

Herein, $R^{18}$ is a methyl, ethyl, isopropyl, cyclohexyl, cyclopentyl, vinyl, acetyl, phenyl or cyano group. Letter b is an integer of 0 to 3.

The cyclic alkyl groups of formula (5) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

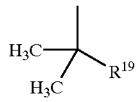

(6)

Herein, $R^{19}$ is an isopropyl, cyclohexyl, cyclopentyl, vinyl, acetyl, phenyl or cyano group.

Examples of the group of formula (6) include 1-vinyldimethyl, 1-acetyldimethyl, 1-phenyldimethyl and 1-cyanodimethyl.

The alkyl groups represented by $R^{10}$ include a variety of such groups, for example, cyclohexyl, cyclopentyl, norbornyl, isobornyl, 5-membered ring lactone, 6-membered ring lactone, and tetrahydrofuran groups as well as alkyl groups substituted with a carbonate, dioxoran, hydroxyethyl, and methoxymethyl group, though not limited thereto.

With the properties of the resist composition taken into account, t and w each are a positive number, u and v each are 0 or a positive number, either one of u and v is not equal to 0, and they preferably satisfy the ranges:

0<w/(t+u+v+w)≦0.5, especially 0.2<w/(t+u+v+w)≦0.4; 0≦v/(t+u+v+w)≦0.2, especially 0.01<v/(t+u+v+w)≦0.1; and
0≦u/(t+u+v+w)≦0.05, especially 0<u/(t+u+v+w)<0.02.

If w is 0, indicating that the polymer of formula (2) does not contain the unit accompanied with w, there may result a reduced contrast of alkali dissolution rate and a poor resolution. If the proportion of t is too high, the alkali dissolution rate of unexposed areas may become too high. If both u and v are 0, there may result shortcomings such as poor resolution and poor dry etching resistance. By properly selecting the values of t, u, v and w within the above-defined ranges, it becomes possible to control the size and configuration of a resist pattern as desired.

The polymers of formulas (1) and (2) each should have a weight average molecular weight (Mw) of 1,000 to 500,000, and preferably 3,000 to 30,000. With too low a Mw, the resist composition becomes less resistant to heat. With too high a Mw, alkali dissolution is reduced and a footing phenomenon tends to arise after pattern formation.

In the polymers of the invention, if the polyhydroxystyrene and the (meth)acrylate copolymer have a wide molecular weight distribution or dispersity (Mw/Mn), it becomes difficult to design the number of crosslinks because of the presence of lower and higher molecular weight polymer components. This sometimes precludes consistent formulation of resist compositions to the same performance. The influences of molecular weight and dispersity become stronger as the pattern rule becomes finer. Therefore, the polyhydroxystyrene and the (meth)acrylate copolymer should preferably have a narrow dispersity (Mw/Mn) of 1.0 to 2.0, especially 1.0 to 1.5, in order to provide a resist composition suitable for micropatterning to a small feature size.

Resist Composition

The mixture of the polymers of formulas (1) and (2) is useful as a base resin in a chemical amplification, positive resist composition. The invention provides a chemical amplification, positive resist composition comprising the polymeric mixture as a base resin.

Specifically, a first embodiment of the invention is a chemical amplification, positive resist composition comprising (A) an organic solvent, (B) the polymeric mixture of the polymers of formulas (1) and (2) as a base resin, and (C) a photoacid generator.

A second embodiment of the invention is a chemical amplification, positive resist composition comprising (A) an organic solvent, (B) the polymeric mixture of the polymers of formulas (1) and (2) as a base resin, (C) a photoacid generator, and (D) a dissolution regulator.

In either embodiment, the resist composition may further include (E) a basic compound.

In the chemical amplification, positive resist composition, component (A) is an organic solvent. Illustrative, non-limiting, examples of the organic solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2 and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl) diphenylsulfonium, bis(4-tert-butoxyphenyl) phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxy-benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl) iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxy-benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyl-diazomethane compounds such as bis(ethylsulfonyl) diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo [2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6- dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is nonvolatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0 to 20 parts, and especially 1 to 10 parts by weight per 100 parts by weight of the solids in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution regulator (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution regulator may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution regulator may fail to yield an improved resolution, whereas too much amounts would lead to slimming of the patterned film, and thus a decline in resolution.

Illustrative, non-limiting, examples of the dissolution regulator (D) which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl)valerate,
tert-butyl 4,4-bis(4'-(2"-tetrahydrofuranyloxy)phenyl)valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl)valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, truisopropylamine, tri-n-butylamine, truisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, truisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Also useful are substituted ones of the hydroxyl group-bearing nitrogenous compounds in which some or all of the hydrogen atoms of hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris(2-ethoxyethyl)amine, tris(2-acetoxyethyl)amine, tris(2-(methoxymethoxy)ethylyamine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{(2-hydroxyethoxy)ethoxy}ethyl]amine.

The basic compounds may be used alone or in admixture of two or more. The basic compound is preferably formulated in an amount of 0 to 2 parts, and especially 0.01 to 1 part by weight, per 100 parts by weight of the solids in the resist composition. The use of more than 2 parts of the basis compound would result in too low a sensitivity.

In the resist composition, a surfactant may be added for improving coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Aashiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the solids in the resist composition.

For the microfabrication of integrated circuits, any well-known lithography may be used to form a resist pattern from the chemical amplification, positive working, resist composition comprising (A) an organic solvent, (B) a polymeric mixture of the polymers of formulas (1) and (2), and (C) a photoacid generator, as illustrated above, according to the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micro-patterning using such actinic radiation as deep UV with a wavelength of 254 to 193 nm, vacuum UV with a wavelength of 157 nm, electron beams, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation.

Examples & Comparative Examples

Chemical amplification, positive resist compositions were prepared according to the formulation shown in Tables 1 and 2. The components listed in Tables 1 and 2 have the following meaning.

Polymer A: poly(p-hydroxystyrene) in which hydroxyl groups are protected with 15 mol % of 1-ethoxyethyl groups and 15 mol % of tert-butoxycarbonyl groups, having a weight average molecular weight of 12,000.
Polymer B: poly(p-hydroxystyrene) in which hydroxyl groups are protected with 25 mol % of 1-ethoxyethyl groups and crosslinked with 3 mol % of 1,4-butanediol divinyl ether, having a weight average molecular weight of 13,000.
Polymer C: poly(p-hydroxystyrene) in which hydroxyl groups are protected with 30 mol % of 1-ethoxyethyl groups, having a weight average molecular weight of 12,000.
Polymer D: p-hydroxystyrene-1-ethylcyclopentyl methacrylate copolymer having a compositional ratio (molar ratio) of 72:28, the p-hydroxystyrene portion being crosliked with 2 mol % of 1,4-butanediol divinyl ether, the copolymer having a weight average molecular weight of 11,000.
Polymer E: p-hydroxystyrene-1-ethylcyclopentyl methacrylate-isobornyl acrylate copolymer having a compositional ratio (molar ratio) of 73:22:5 and a weight average molecular weight of 16,000.
Polymer F: p-hydroxystyrene-1-ethylcyclopentyl methacrylate-1-tetrahydrofuranylmethyl methacrylate copolymer having a compositional ratio (molar ratio) of 68:27:5 and a weight average molecular weight of 16,000.
PAG1: triphenylsulfonium 4-(4'-methylphenylsulfonyloxy)phenylsulfonate
PAG2: (4-tert-butylphenyl)diphenylsulfonium 4-(4'-methylphenylsulfonyloxy)phenylsulfonate
PAG3: bis(cyclohexylsulfonyl)diazomethane
PAG4: bis(2,4-dimethylphenylsulfonyl)diazomethane
Dissolution regulator: bis(4-(2'-tetrahydropyranyloxy)phenyl)methane
Basic compound A: tris(2-methoxyethyl)amine
Surfactant A: FC-430 (Sumitomo 3M K.K.)
Surfactant B: Surflon S-381 (Asahi Glass K.K.)
Solvent A: propylene glycol methyl ether acetate
Solvent B: ethyl lactate

TABLE 1

| Components (pbw) | E1 | E2 | E3 | E4 |
|---|---|---|---|---|
| Polymer A | 60 | — | — | — |
| Polymer B | — | 70 | 60 | — |
| Polymer C | — | — | — | 60 |
| Polymer D | 20 | 30 | — | — |
| Polymer E | — | — | 20 | — |
| Polymer F | — | — | — | 20 |
| PAG1 | 1 | 1 | 1 | 1 |
| PAG2 | — | — | — | — |
| PAG3 | 2 | 2 | 2 | 2 |
| PAG4 | — | — | — | — |
| Dissolution regulator A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| Components (pbw) | CE1 | CE2 | CE3 | CE4 | CE5 |
|---|---|---|---|---|---|
| Polymer A | 80 | 80 | — | — | — |
| Polymer B | — | — | 80 | — | — |
| Polymer C | — | — | — | — | — |
| Polymer D | — | — | — | 80 | — |
| Polymer E | — | — | — | — | 80 |

TABLE 2-continued

| Components (pbw) | CE1 | CE2 | CE3 | CE4 | CE5 |
|---|---|---|---|---|---|
| Polymer F | — | — | — | — | — |
| PAG1 | 1 | — | 1 | 1 | 1 |
| PAG2 | — | 1 | — | — | — |
| PAG3 | 2 | — | 2 | 2 | 2 |
| PAG4 | — | 2 | — | — | — |
| Dissolution regulator A | — | 0.01 | — | — | — |
| Basic compound A | 0.2 | 0.2 | 0.2 | 0.2 | 0.2 |
| Surfactant A | 0.07 | 0.07 | 0.07 | 0.07 | 0.07 |
| Surfactant B | 0.07 | 0.07 | 0.07 | 0.07 | 0.07 |
| Solvent A | 300 | 300 | 300 | 300 | 300 |
| Solvent B | 130 | 130 | 130 | 130 | 130 |

The resist materials thus obtained were each filtered through a 0.2-$\mu$m Teflon filter, thereby giving resist solutions. These resist solutions were spin-coated onto silicon wafers, then baked on a hot plate at 100° C. for 90 seconds to give resist films having a thickness of 0.6 $\mu$m.

The resist films were exposed using an excimer laser stepper NSR2005EX (Nikon K.K., NA 0.5), then baked at 110° C. for 90 seconds (post-exposure baking: PEB), and developed with a solution of 2.38% tetramethylammonium hydroxide in water, thereby giving positive patterns (Examples 1 to 4 and Comparative Examples 1–5).

The resulting resist patterns were evaluated as described below.

Resist Pattern Evaluation

Provided that the exposure dose which provides a 1:1 resolution at the top and bottom of a 0.24-pm line-and-space pattern was the optimum exposure dose (sensitivity Eop), the minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

Other Evaluation

With respect to the slimming of resist film after development, the cross section of the unexposed portion of the resist film was observed under a scanning electron microscope. Film thickness change was rated "good" when the reduction of film thickness is within 0.5% (within 0.003 $\mu$m) based on the coated film thickness (0.6 $\mu$m) prior to development, "somewhat poor" for a thickness reduction within 1%, and "poor" for a thickness reduction of more than 1%.

With respect to the dry etching resistance after development, the resist film was etched, and a cross section of the pattern shape was observed under a scanning electron microscope. As a relative evaluation, the shape was rated good or poor.

The etching was conducted under the following conditions.

Press: 250 mJ
RF Power: 800 W
Gas:

1) $CHF_3$ 20 ml/min.
2) $CF_4$ 20 ml/min.
3) Ar 400 ml/min.

Etching time: 2.5 minutes (150 seconds)

The results are shown in Table 3.

TABLE 3

| | Sensitivity (mJ/cm$^2$) | Resolution ($\mu$m) | Profile | PED stability | Film thickness change | Etching resistance |
|---|---|---|---|---|---|---|
| E1 | 27 | 0.18 | rectangular | −7 | good | good |
| E2 | 25 | 0.16 | rectangular | −9 | good | good |
| E3 | 25 | 0.15 | rectangular | −9 | good | good |
| E4 | 26 | 0.15 | rectangular | −10 | good | good |
| CE1 | 26 | 0.21 | Slightly tapered | −10 | somewhat poor | poor |
| CE2 | 25 | 0.21 | Slightly tapered | −12 | somewhat poor | poor |
| CE3 | 22 | 0.18 | rectangular | −14 | poor | poor |
| CE4 | 30 | 0.18 | rectangular | −7 | somewhat poor | good |
| CE5 | 31 | 0.22 | Slightly tapered | −8 | good | good |

There have been described chemically amplified, positive resist compositions in which both a polyhydroxystyrene derivative and a copolymer of hydroxystyrene and (meth) acrylate, especially a ternary copolymer are blended as the base resin. The inventive resist compositions surpass prior art resist compositions with respect to dry etching resistance, sensitivity, resolution, and process adaptability, and are improved in the slimming of pattern films after development with aqueous base solutions.

Japanese Patent Application No. 2000-064277 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemical amplification type resist composition comprising a polymeric mixture of a polymer comprising recurring units of the general formula (1) and having a weight average molecular weight of 1,000 to 500,000 and a polymer comprising recurring units of the general formula (2) and having a weight average molecular weight of 1,000 to 500,000,

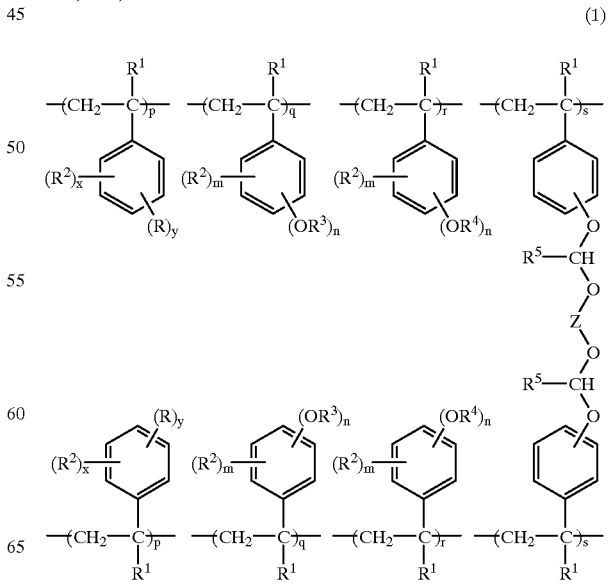

wherein R is a hydroxyl group or a OR$^3$ group, R$^1$ is hydrogen or methyl, R$^2$ is a straight, branched or cyclic alkyl group of 1 to 8 carbon atoms, R$^3$ is a group of the following formula (3):

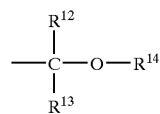

(3)

wherein, R$^{12}$ and R$^{13}$ are independently hydrogen or straight, branched or cyclic alkyl groups of 1 to 18 carbon atoms, R$^{14}$ is a monovalent hydrocarbon group of 1 to 18 carbon atoms which optionally has a hetero atom and optionally has one or more hydrogen atoms replaced by hydroxyl, alkoxy, oxo, amino or alkylamino groups, alternatively, a pair of R$^{12}$ and R$^{13}$, a pair of R$^{12}$ and R$^{14}$, or a pair of R$^{13}$ and R$^{14}$, taken together, form a ring in which the pair together is a straight or branched alkylene group of 1 to 18 carbon atoms, R$^4$ is an acid labile group, R$^5$ is methyl or ethyl, Z is a straight, branched or cyclic alkylene group of 1 to 10 carbon atoms, x is 0 or a positive integer, y is a positive integer, satisfying x+y ≦5, m is 0 or a positive integer, n is a positive integer, satisfying m+n ≦5, q is a positive number, p, r and s each are 0 or a positive number, satisfying p+q+r+s=1,

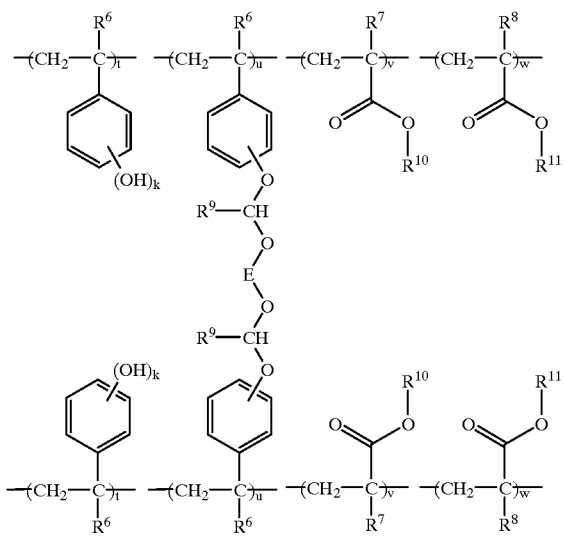

(2)

wherein R$^6$, R$^7$ and R$^8$ each are hydrogen or methyl, R$^9$ is methyl or ethyl, E is a straight, branched or cyclic alkylene group of 1 to 10 carbon atoms, R$^{10}$ a straight, branched or cyclic alkyl group of 1 to 20 carbon atoms, which may contain an oxygen or sulfur atom, provided that R$^{10}$ is not a tertiary alkyl group. R$^{11}$ is a tertiary alkyl group of 1 to 20 carbon atoms, k is 0 or a positive integer of up to 5, t and w each are a positive number, u and v each are 0 or a positive number, either one of u and v is not equal to 0, satisfying t+u+v+w=1.

2. A chemical amplification type, positive resist composition comprising (A) an organic solvent, (B) the polymeric mixture of claim 1 as a base resin, and (C) a photoacid generator.

3. A chemical amplification type, positive resist composition comprising (A) an organic solvent, (B) the polymeric mixture of claim 1 as a base resin, (C) a photoacid generator, and (D) a dissolution regulator.

4. The resist composition of claim 2, further comprising (E) a basic compound.

5. The composition of claim 1, wherein in formula (1), r is a positive number and the acid labile group R$^4$ is selected from the group consisting of:

branched or cyclic, tertiary alkyl groups with 4 to 20 carbon atoms;

trialkylsilyl groups whose alkyl groups each have 1 to 6 carbon atoms;

oxoalkyl groups of 4 to 20 carbon atoms; and, groups of the following formulae (3) and (4):

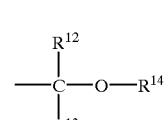

(3)

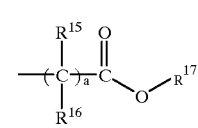

(4)

wherein,

R$^{12}$ and R$^{13}$ are independently hydrogen or straight, branched or cyclic alkyl groups of 1 to 18 carbon atoms, R$^{14}$ is a monovalent hydrocarbon group of 1 to 18 carbon atoms, which may have a hetero atom and in which some hydrogen atoms are replaced by hydroxyl, alkoxy, oxo, amino or alkylamino groups, alternatively, a pair of R$^{12}$ and R$^{13}$, a pair of R$^{12}$ and R$^{14}$, or a pair of R$^{13}$ and R$^{14}$, taken together, may form a ring, in which the pair is a straight or branched alkylene group of 1 to 18 carbon atoms, R$^{15}$ and R$^{16}$ independently have the same definition as R$^{12}$ and R$^{13}$, R$^{17}$ is a straight, branched or cyclic alkyl group of 4 to 40 carbon atoms, a trialkylsilyl group whose alkyl groups each have 1 to 6 carbon atoms, or oxoalkyl group of 4 to 20 carbon atoms, and the letter a is an integer of 0 to 6.

6. The composition of claim 1, wherein in the polymer of formula (1) p, q and r are positive numbers and p, q, r and s satisfy:

$0<(q+r)/(p+q+r+s)≦0.8$, and $0.01≦s/(p+q+r+s)≦0.1$.

7. The composition of claim 1, wherein in the polymer of formula (2) t, u, v and w satisfy the ranges:

$0<w/(t+u+v+w) 0.5;$ $0≦v/(t+u+v+w) 0.2;$ and $0 \leq u/(t+u+v+w)$ 0.05.

8. The composition of claim 1, wherein the polymers of formulae (1) and (2) each have a weight average molecular weight of 3,000 to 30,000.

9. A chemical amplification type resist composition comprising a polymeric mixture of a polymer comprising recurring units of the general formula (1) and having a weight average molecular weight of 1,000 to 500,000 and a polymer comprising recurring units of the general formula (2) and having a weight average molecular weight of 1,000

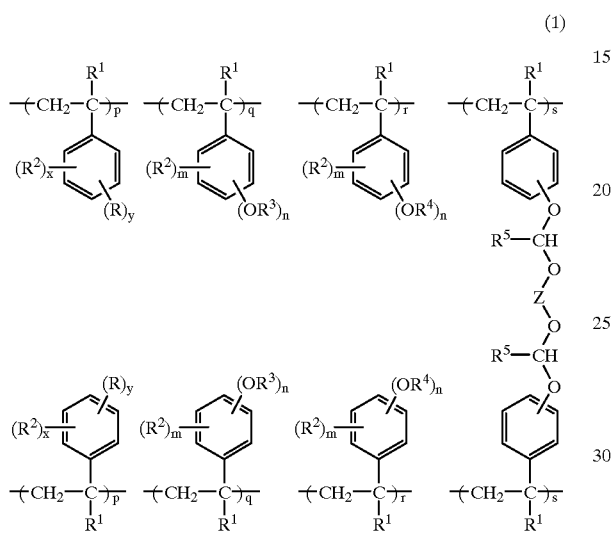

to 500,000, wherein R is a hydroxyl group or a $OR^3$ group, $R^1$ is hydrogen or methyl, $R^2$ is a straight, branched or cyclic alkyl group of 1 to 8 carbon atoms, $R^3$ is a group of the following formula (3):

wherein, $R^{12}$ and $R^{13}$ are independently hydrogen or straight, branched or cyclic alkyl groups of 1 to 18 carbon atoms, $R^{14}$ is a monovalent hydrocarbon group of 1 to 18 carbon atoms which optionally has a hetero atom and optionally has one or more hydrogen atoms replaced by hydroxyl, alkoxy, oxo, amino or alkylamino groups, alternatively, a pair of $R^{12}$ and $R^{13}$, a pair of $R^{12}$ and $R^{14}$, or a pair of $R^{13}$ and $R^{14}$, taken together, form a ring in which the pair together is a straight or branched alkylene group of 1 to 18 carbon atoms, $R^4$ is an acid labile group, $R^5$ is methyl or ethyl, Z is a straight, branched or cyclic alkylene group of 1 to 10 carbon atoms, x is 0 or a positive integer, y is a positive integer, satisfying $x+y \leq 5$, m is 0 or a positive integer, n is a positive integer, satisfying $m+n \leq 5$, q is a positive number, p, r and s each are 0 or a positive number, satisfying $p+q+r+s=1$,

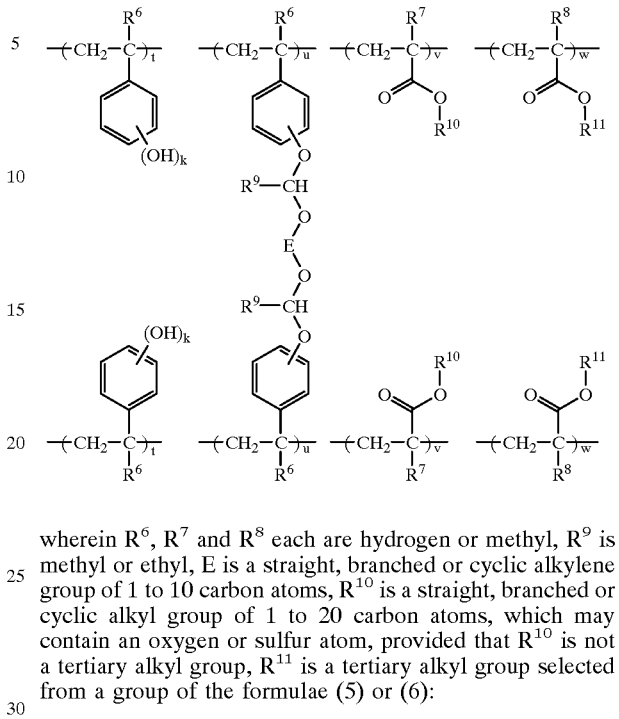

wherein $R^6$, $R^7$ and $R^8$ each are hydrogen or methyl, $R^9$ is methyl or ethyl, E is a straight, branched or cyclic alkylene group of 1 to 10 carbon atoms, $R^{10}$ is a straight, branched or cyclic alkyl group of 1 to 20 carbon atoms, which may contain an oxygen or sulfur atom, provided that $R^{10}$ is not a tertiary alkyl group, $R^{11}$ is a tertiary alkyl group selected from a group of the formulae (5) or (6):

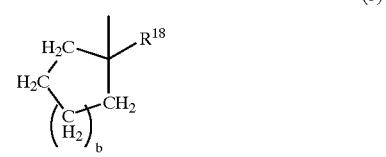

wherein, $R^{18}$ is a methyl, ethyl, isopropyl, cyclohexyl, cyclopentyl, vinyl, acetyl, phenyl or cyano group, and b is an integer of 0 to 3, and

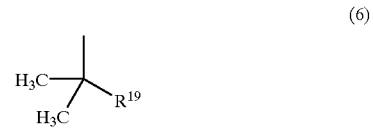

wherein, $R^{19}$ is an isopropyl, cyclohexyl, cyclopentyl, vinyl, acetyl, phenyl or cyano group, and k is 0 or a positive integer of up to 5, t and w each are a positive number, u and v each are 0 or a positive number, either one of u and v is not equal to 0, satisfying $t+u+v+w=1$.

10. A chemical amplification type, positive resist composition comprising
   (A) an organic solvent,
   (B) the polymeric mixture of claim 9 as a base resin, and
   (C) a photoacid generator.

11. A chemical amplification type, positive resist composition comprising
   (A) an organic solvent,
   (B) the polymeric mixture of claim 9 as a base resin,
   (C) a photoacid generator, and
   (D) a dissolution regulator.

12. The resist composition of claim 10, further comprising (E) a basic compound.

13. The composition of claim 9, wherein in formula (1), r is a positive number and the acid labile group $R^4$ is selected from the group consisting of:
- branched or cyclic, tertiary alkyl groups with 4 to 20 carbon atoms;
- trialkylsilyl groups whose alkyl groups each have 1 to 6 carbon atoms;
- oxoalkyl groups of 4 to 20 carbon atoms; and,
- groups of the following formulae (3) and (4):

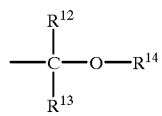

(3)

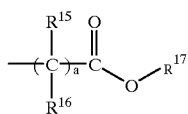

(4)

wherein,
$R^{12}$ and $R^{13}$ are independently hydrogen or straight, branched or cyclic alkyl groups of 1 to 18 carbon atoms, $R^{14}$ is a monovalent hydrocarbon group of 1 to 18 carbon atoms, which may have a hetero atom and in which some hydrogen atoms are replaced by hydroxyl, alkoxy, oxo, amino or alkylamino groups, alternatively, a pair of $R^{12}$ and $R^{13}$, a pair of $R^{12}$ and $R^{14}$, or a pair of $R^{13}$ and $R^{14}$, taken together, may form a ring, in which the pair is a straight or branched alkylene group of 1 to 18 carbon atoms, $R^{15}$ and $R^{16}$ independently have the same definition as $R^{12}$ and $R^{13}$, $R^{17}$ is a straight, branched or cyclic alkyl group of 4 to 40 carbon atoms, a trialkylsilyl group whose alkyl groups each have 1 to 6 carbon atoms, or oxoalkyl group of 4 to 20 carbon atoms, and the letter a is an integer of 0 to 6.

14. The composition of claim 9, wherein in the polymer of formula (1) p, q and r are positive numbers and p, q, r and s satisfy:

$$0<(q+r)/(p+q+r+s)\leq 0.8, \text{ and}$$

$$0.01\leq s/(p+q+r+s) \, 0.1.$$

15. The composition of claim 9, wherein in the polymer of formula (2) t, u, v and w satisfy the ranges:

$$0<w/(t+u+v+w)\leq 0.5;$$

$$0\leq v/(t+u+v+w) \, 0.2; \text{ and}$$

$$0\leq u/(t+u+v+w) 0.05.$$

16. The composition of claim 9, wherein the polymers of formulae (1) and (2) each have a weight average molecular weight of 3,000 to 30,000.

* * * * *